United States Patent [19]

Kobashi et al.

[11] Patent Number: 5,066,938
[45] Date of Patent: Nov. 19, 1991

[54] DIAMOND FILM THERMISTOR

[75] Inventors: Koji Kobashi, Nishinomiya, Japan; Koichi Miyata, Raleigh, N.C.; Kazuo Kumagai; Takayoshi Inoue, both of Kobe, Japan; Hiroyuki Tachibana, Tsukuba, Japan; Akimitsu Nakaue, Kobe, Japan

[73] Assignee: Kabushiki Kaisha Kobe Seiko Sho, Kobe, Japan

[21] Appl. No.: 596,068

[22] Filed: Oct. 11, 1990

[30] Foreign Application Priority Data

Oct. 16, 1989 [JP] Japan .................... 1-270085

[51] Int. Cl.⁵ .............................................. H01C 7/10
[52] U.S. Cl. ............................................. 338/22 SD
[58] Field of Search ............... 338/225 SD, 72 R; 29/612

[56] References Cited

U.S. PATENT DOCUMENTS 4,806,900 2/1989 Fujimori et al. ............... 338/22 R

FOREIGN PATENT DOCUMENTS 0262601 4/1988 European Pat. Off. .
1-116480 5/1989 Japan .

Primary Examiner—Marvin M. Lateef
Attorney, Agent, or Firm—Oblon, Spivak, McClelland, Maier & Neustadt

[57] ABSTRACT

A diamond thin film thermistor having a substrate, an electrically insulating diamond layer formed on the substrate by vapor-phase synthesis, a semiconducting diamond layer as a temperature-sensing part on the electrically insulating diamond layer by vapor-phase synthesis, and metal thin film electrodes attached to the semiconducting diamond layer. A plurality of such diamond thin film thermistors can simultaneously be formed on a single substrate, and the substrate is cut with a dicing saw to provide individual diamond thin film thermistor chips of the same quality.

2 Claims, 5 Drawing Sheets

DIAMOND FILM THERMISTOR

BACKGROUND OF THE INVENTION

1. Field of the Invention

The present invention relates to a diamond film thermistor capable of sensing temperature at a high response speed and having an excellent stability against heat, radiation and chemicals.

2. Description of the Prior Art

Ceramics of metal oxides, nitrides and carbides, which have large temperature coefficients of electrical resistance, are used as resistor materials for thin film thermistors. A standard thermistor structure is shown in FIG. 7: a thin resistance film b is formed on an insulating substrate a, metal electrodes c are attached to the thin resistance film b, and lead wires d are connected to the metal electrodes c. The electrical resistances of most ceramic resistors have negative temperature coefficients (their resistances decrease as the temperature increases), and thus the temperature is estimated from the electrical resistance of the resistor.

Japanese Patent Laid-open (Kokai) No. 62-115804 disclosed a thermistor, as shown in FIG. 8, which employed a SiC film as a resistor. The thermistor was constructed by first depositing electrodes $c_1$ on an insulating substrate $a_1$, such as alumina, forming a SiC film $b_1$ on the substrate $a_1$ by sputtering, and then connecting lead wires $d_1$ to the electrodes $c_1$. To protect the SiC film $b_1$ it was coated with a protective film $e_1$ (glass) having a specific coefficient of thermal expansion and a specific working temperature.

A thermistor made by a diamond film is described in New Diamond, Vol. 5, No. 2 (see FIG. 9). It is fabricated by depositing a p-type diamond film $b_2$ on a silicon nitride ($Si_3N_4$) substrate $a_2$ by microwave plasma chemical vapor deposition (CVD) using a source gas consisting of $CH_4$ and $H_2$ and containing diborane ($B_2H_6$) as a doping agent, forming electrodes $c_2$ of Au, Mo or Ti, and coating the diamond film $b_2$ with a protective film $e_2$ of $SiO_2$.

Thermistors employing ceramic resistors usually requires a sputtering process for film formation. However, it is difficult to control the stoichiometry of the atomic composition by sputtering. It is also difficult to form a metal resistor uniformly and hence to control the electrical characteristics precisely. Accordingly, the distribution of the characteristics of the thermistors is large, resulting in a low yield of the manufactured thermistors. Furthermore, a deterioration of ceramic thermistor characteristics with time is unavoidable, because the constituent materials of the ceramics is subject to chemical reactions such as oxidation when the thermistor is used, for instance, in the air of steam, and reduction when the thermistor is used in a reducing atmosphere. Therefore, such thermistors become unreliable with time. Regarding the response speed, since ceramics have low thermal conductivities, the ceramic thermistors can not follow a rapid change in the environmental temperature: the response times of ceramic thermistors are in the range of a few seconds or longer.

The SiC thin film thermistor shown in FIG. 8 is less susceptible to the chemical deterioration stated above than ceramic thermistors. However, the thermal conductivity of single crystalline, SiC is as low as 5 W/cm.K, which is lower than that of diamond (20 W/cm.K), and hence the response time of the SiC thin film thermistor is of the order of several tens seconds. On the contrary, the thermal conductivity of diamond thin film is about 10 W/cm.K. Therefore, the response time of diamond thin film thermistors is expected to be about twice better than that of the SiC thin film thermistor. However, the response time of the diamond thin film thermistor, shown in FIG. 9, is in the range of 1 to 2 sec, which is almost comparable to that of the SiC thin film thermistor. This is because (1) the size of the diamond thin film thermistor is as large as 1.5 mm×3.8 mm, (2) the substrate is silicon nitride which has a low thermal conductivity, and finally, (3) the temperature sensing area is a diamond thin film without structure.

Furthermore, the diamond thin film thermistor, shown in FIG. 9, has the following disadvantages: Firstly, since the diamond film is deposited directly on the silicon nitride substrate, the density of grain boundaries between individual diamond grains in the film is high in the area along the substrate. Therefore the area has a poor crystallinity, because amorphous carbon and graphite are contained in the grain boundaries. Such grain boundaries permits a rapid deterioration of the diamond film at high temperatures and deprive of its functions.

Secondly, the diamond film and the electrodes in the diamond thin film thermistor of FIG. 9 are formed on an individual substrate. Therefore, the manufacturing process has a low productivity and a high cost.

SUMMARY OF THE INVENTION

The object of the present invention is to provide diamond thin film thermistors with a high response speed and a uniform quality, suitable for production.

To achieve the object, the present invention provides a diamond thin film thermistor which consists of an electrically insulating diamond layer on the substrate, a temperature-sensing semiconducting diamond layer on the electrically insulating diamond layer, and electrodes on the semiconducting diamond layer.

The temperature-sensing area of the diamond thin film thermistor in accordance with the present invention may be formed in a desired pattern by the selective deposition of the insulating diamond layer and/or the semiconducting diamond layer.

In order to achieve a small thermistor which is less than about a mm, the photolithography may be used.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

Prior to the description of diamond thin film thermistors embodying the present invention, different processed A and B for fabricating the thermistors will be described.

Process A

Figure 1:
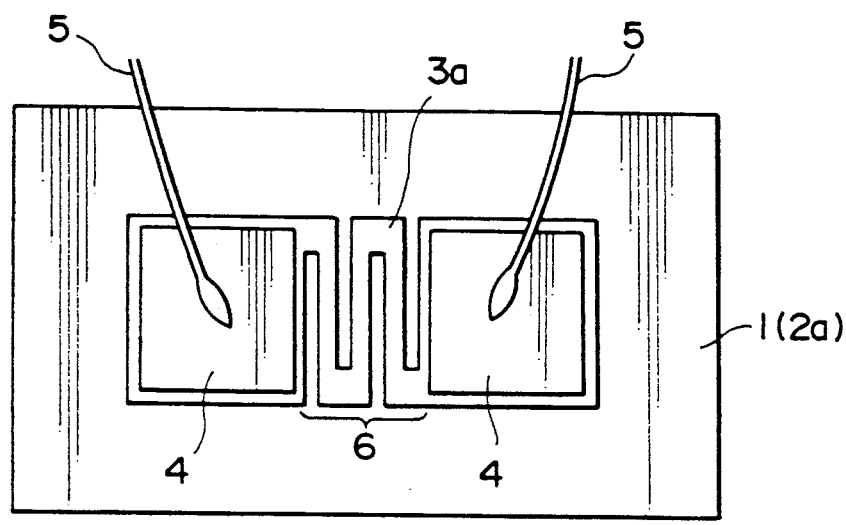
FIG. 1 is a schematic plan view of a diamond thin film thermistor in a preferred embodiment according to the present invention.
Figure 2:
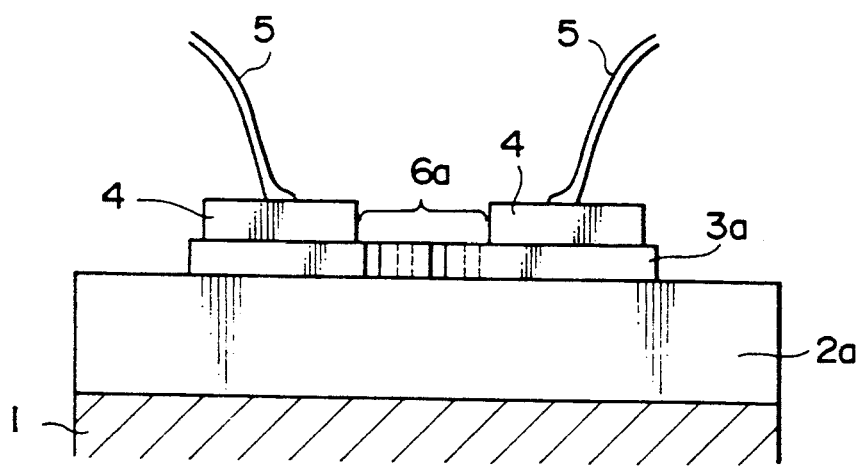
FIG. 2 is a side view of the diamond thin film thermistor of FIG. 1.

A diamond thin film thermistor in accordance with the present invention shown in FIGS. 1 and 2 is manufactured by Process A.

Step 1: An electrically insulating diamond layer 2a of a uniform thickness is formed on a ceramic or metal substrate 1. The thickness of the layer 2a is on the order of 10 μm.

Step 2: A semiconducting diamond layer 3a is formed by a selective deposition method on the diamond layer 2a in a desired pattern. The thickness of the semiconducting diamond layer 3a is on the order of 2 μm.

Step 3: Metal electrodes 4 are formed by photolithography.

Step 4: Lead wires 5 are connected to the metal electrodes 4.

Step 5: When necessary, the diamond thin film thermistor thus constructed is coated with an oxidation-resistant protective film.

In FIGS. 1 and 2, indicated by 6a is a temperature-sensing part.

Process B

Figure 3:
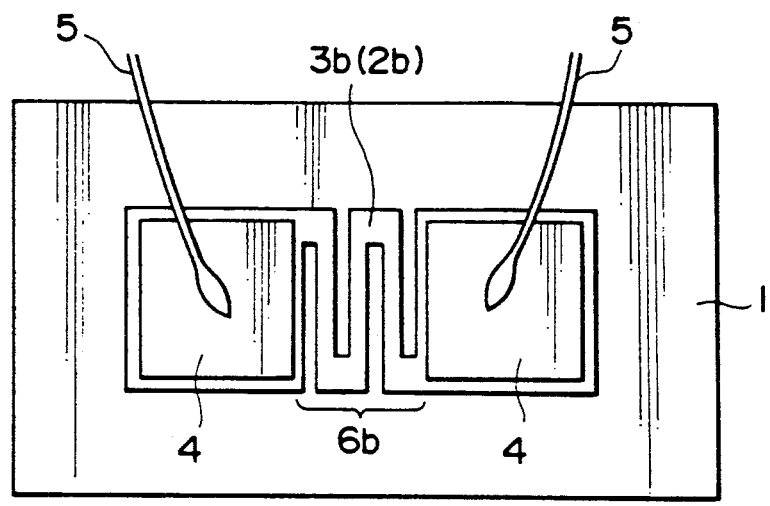
FIG. 3 is a schematic plan view of a diamond thin film thermistor in another embodiment according to the present invention.
Figure 4:
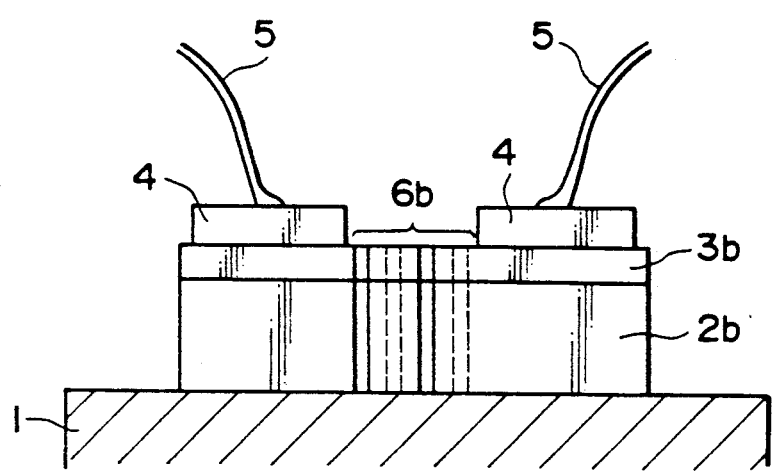
FIG. 4 is a side view of the diamond thin film thermistor of FIG. 3.

A diamond thin film thermistor in accordance with the present invention shown in FIGS. 3 and 4 is manufactured by Process B.

Step 1: An electrically insulating diamond layer 2b is formed in a pattern of a thermistor on a ceramic or metal substrate 1. The thickness of the diamond layer 2b is, for example, 10 μm.

Step 2: A semiconducting diamond layer 3b is formed on the diamond layer 2b. The thickness of the diamond layer 3b is, for example, 2 μm.

Step 3: Metal electrodes 4 are formed on the diamond layer 3b by photolithography.

Step 4: Lead wires 5 are connected to the metal electrodes 4.

Step 5: When necessary the diamond thin film thermistor thus fabricated is coated with an oxidation-resistant protective film. If the diamond thin film thermistor is to be used in an environment which will not deteriorate the semiconductor diamond thin film by oxidation, Step 5 may be omitted.

In FIGS. 3 and 4, indicated by 6b is a temperature-sensing part.

The diamond thin film thermistors in accordance with the present invention have the following advantages.

(1) Since diamond has a high thermal conductivity and the temperature-sensing parts 6a and 6b can be designed to be sensitive to heat, as shown in FIGS. 1 and 3, the diamond thin film thermistor can have a high response speed.

(2) Since the semiconducting diamond layers 3a and 3b are formed by vapor-phase synthesis on the electrically insulating diamond layer 2a and 2b respectively, the diamond layers 3a and 3b have a low grain boundary density and satisfactory crystallinity. Accordingly, the diamond thin film thermistors of the present invention can be used in a high-temperature environment.

(3) Because of the electrically insulating diamond layers 2a and 2b, the semiconducting diamond layers 3a and 3b are electrically insulated from the substrates 1. Accordingly, for the substrate 1, materials with a resistivity on the order of 1000 Ωcm, such as silicon can be used instead of electrically insulating materials such as alumina.

Figure 5:
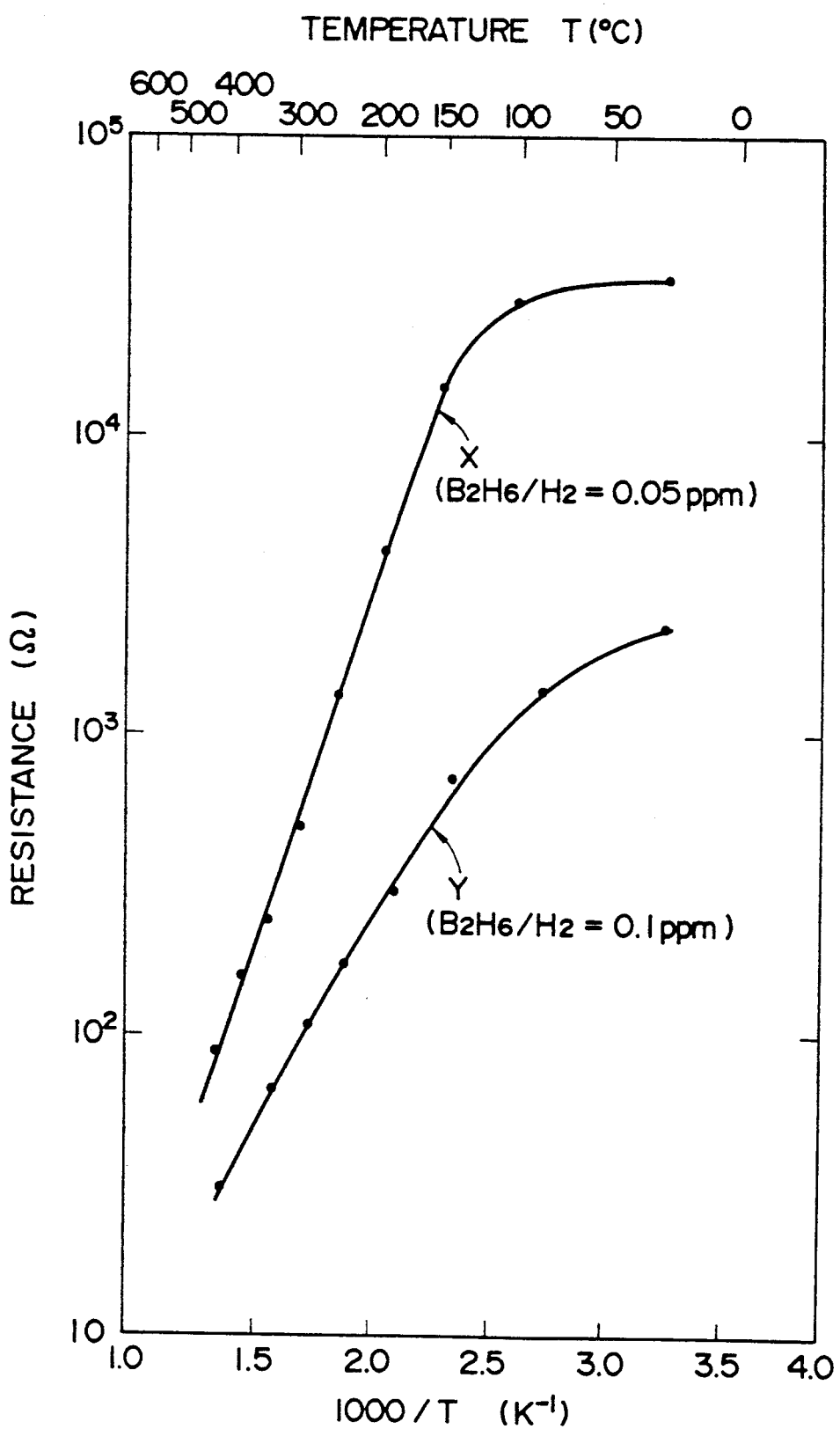
FIG. 5 is a graph showing the temperature-dependence of the electrical resistance of a diamond thin film thermistor embodying the present invention, in which the temperature and the reciprocal temperature is measured on the horizontal axis, and the resistance is measure on the vertical axis.

(4) For the diamond layer formation in the present invention, one can use any of the known vapor-phase synthesis methods: radio-frequency plasma chemical vapor deposition (CVD), microwave plasma CVD, hot filament CVD, dc discharge CVD ... etc. For the source gas, any of the gases known to form diamonds can be used, for instance, methane, carbon mono oxide, alcohol and a methane-oxygen mixture. Usually these gases are diluted by hydrogen. When diborane ($B_2H_6$) is added to the source gas by less than several ppm, the diamond film is doped with boron (B) to be a p-type semiconductor. On the other hand, when silane ($SiH_4$) is added to the source gas, the diamond film is doped with silicon (Si) to be a n-type semiconductor. The dopant concentration in the semiconducting diamond layer can be controlled by changing the doping gas concentration in the source gas. Therefore, the electrical conductivity and temperature characteristic of the semiconducting diamond layer of the diamond thin film thermistor can be controlled to have the desired characteristics. For instance, FIG. 5 shows a variation of the resistance ($\Omega$) of the diamond thin film thermistor with temperature T (°C.) and inverse temperature $1000/T$ ($K^{-1}$) for two doping gas concentrations.

(5) Diamond is highly stable under harsh environmental conditions such as high temperature, radiation and chemical corrosion. Accordingly, the characteristics of the diamond thin film thermistor of the present invention hardly change with time.

(6) According to the present invention, diamond thin film thermistors can simultaneously be formed on a substrate by selective deposition and selective photolithography as shown in FIGS. 1 and 3. The substrate is then cut to provide an individual diamond thin film thermistor of a few square millimeters in size. Having a small heat capacity, such a diamond thin film thermistor is able to respond at a high response speed to the variation of the environmental temperature. A diamond thin film thermistor having a desired electrical resistance and a desired temperature characteristic can be manufactured by properly determining the thermistor pattern, the thickness of the diamond layers and the dopant concentration in the semiconducting diamond layer.

(7) Since a plurality of diamond thin film thermistors can simultaneously be formed on a substrate by selective deposition and photolithography, diamond thin film ,thermistors with an identical quality can be mass produced.

Examples of the diamond thin film thermistors in accordance with the present invention will be described hereinafter.

EXAMPLE 1 (SEE FIGS. 1 AND 2)

Figure 6A:
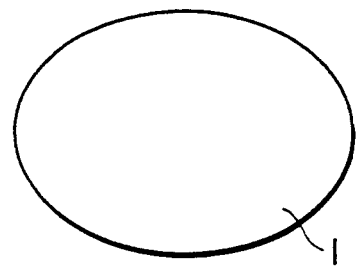
FIG. 6A-6C are a perspective view of a process for photolithographically fabricating diamond thin film thermistors in accordance with the present invention.
Figure 6B:
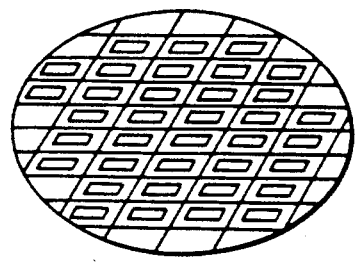
Figure 6C:
Figure 7:
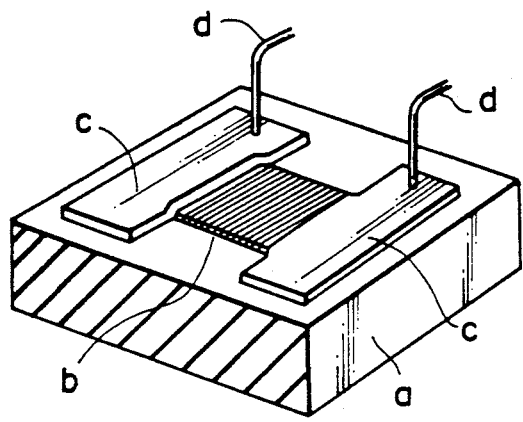
FIG. 7 is a perspective view of a conventional resistance film thermistor.
Figure 8:
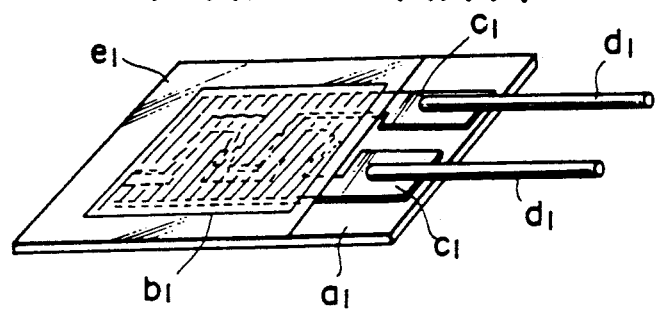
FIG. 8 is a perspective view of a conventional SiC thin film thermistor.
Figure 9:
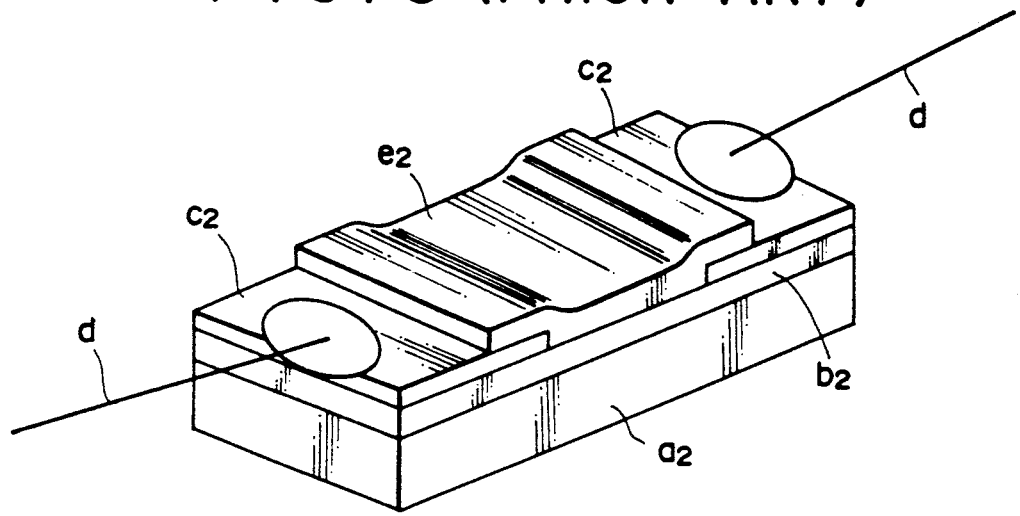
FIG. 9 is a perspective view of a conventional diamond thermistor.

A 10 μm thick electrically insulating diamond film was deposited uniformly on a 3 inch silicon wafer 1, as shown in FIG. 6A by microwave plasma CVD. Twenty B-doped p-type diamond layer 3a (2 μm thick) with a pattern of FIG. 1 were formed by selective deposition using a source gas including 0.05 ppm diborane in an arrangement as shown in FIG. 6B. Electrodes 4 of titanium gold bilayer were formed by photolithography. Then, the silicon wafer 1 was cut to obtain individual diamond thin film thermistor chips of 0.5 mm × 1.5 mm in size as shown in FIG. 6C. Finally, gold lead wires 5 were attached to each diamond thin film thermistor chips as shown in FIG. 2.

The temperature-dependence of the electrical resistance of the diamond thin film thermistor is indicated by curve X in FIG. 5. The response time of the diamond thin film thermistors was 0.5 sec.

EXAMPLE 2

Diamond thin film thermistors were manufactured by the same process as that employed in Example 2, except that the source gas included 0.1 ppm diborane.

The temperature-dependence of the electrical resistance of the diamond thin film thermistors is indicated by curve Y in FIG. 5. The response time of the diamond thin film thermistors was 1.0 sec.

EXAMPLE 3

The diamond thin film thermistor of Example 1 was coated with a 2 μm thick as an oxidatium-resistant protective film silicon nitride.

The temperature-dependence of the electrical resistance of the diamond thin film thermistor was substantially the same as that indicated by the curve X in FIG. 5. The response time was 3.0 sec.

EXAMPLE 4

Electrically insulating diamond films 2b of 10 μm thick and 1 mm × 2 mm in size having a pattern shown in FIG. 3 were formed on a silicon wafer 1 of 0.5 mm thick and 3 in. in diameter by microwave plasma CVD. A B-doped p-type semiconductor diamond layer 3b of 2 μm thick was formed on the electrically insulating diamond layer 2b. Electrodes 4 of titanium and gold thin films were formed on the B-doped diamond layer by photolithography. Then, the silicon wafer 1 was cut with a dicing saw to obtain individual diamond thin film thermistors. Gold lead wires 5 were then attached to the electrodes 4 of each diamond thin film thermistor.

The temperature-dependence of the electrical resistance of the diamond thin film thermistor was substantially the same as that indicated by the curve X in FIG. 5. The response time of the diamond thin film thermistor was 0.8 sec.

As is apparent from the foregoing description, the diamond thin film thermistors in accordance with the present invention are capable of responding to the variation of the environmental temperature within a short response time, have excellent thermistor characteristics as well as high temperature, radiation and chemical resistances, are hardly susceptible to aging, and are suitable for mass-production at a comparatively low manufacturing cost.

Although the invention has been described in its preferred forms with a certain degree of particularity, obviously many changes and variations are possible therein. I is therefore to be understood that the present invention may be practiced otherwise than as specifically described herein without departing from the scope and spirit thereof.

What is claimed is:
1. A diamond thin film thermistor comprising:
    a substrate;
    an electrically insulating diamond layer formed on the substrate by vapor-phase synthesis;
    a semiconducting diamond layer formed by vapor-phase synthesis as a temperature-sensing part on the electrically insulating diamond layer; and
    metal thin film electrodes attached to the semiconducting diamond layer.
2. A diamond thin film thermistor according to claim 1, wherein the temperature-sensing part is formed in a pattern of a width not greater than 1 mm by the selective deposition of the semiconducting diamond layer.

* * * * *